(12) United States Patent
Misso, III et al.

(10) Patent No.: US 10,899,474 B1
(45) Date of Patent: Jan. 26, 2021

(54) PORTABLE FLEET MANAGEMENT SYSTEM FOR AUTONOMOUS AERIAL VEHICLES

(71) Applicant: Dynamic Autonomous Vehicle Technology LLC, Austin, TX (US)

(72) Inventors: Robert Joseph Misso, III, Cedar Park, TX (US); Colin Allyn Guinn, Austin, TX (US); Craig Alan Nehrkorn, Austin, TX (US)

(73) Assignee: Dynamic Autonomous Vehicle Technology LLC, Austin, TX (US)

( * ) Notice: Subject to any disclaimer, the term of this patent is extended or adjusted under 35 U.S.C. 154(b) by 0 days.

(21) Appl. No.: 16/560,775

(22) Filed: Sep. 4, 2019

Related U.S. Application Data

(60) Provisional application No. 62/726,964, filed on Sep. 4, 2018.

(51) Int. Cl.
| | |
|---|---|
| *B64F 1/36* | (2017.01) |
| *H05K 5/02* | (2006.01) |
| *H01R 13/627* | (2006.01) |
| *H01R 31/06* | (2006.01) |
| *H01R 31/02* | (2006.01) |
| *H05K 7/14* | (2006.01) |

(52) U.S. Cl.
CPC ......... *B64F 1/364* (2013.01); *H01R 13/6273* (2013.01); *H01R 31/02* (2013.01); *H01R 31/06* (2013.01); *H05K 5/0217* (2013.01); *H05K 7/14* (2013.01)

(58) Field of Classification Search
None
See application file for complete search history.

(56) References Cited

U.S. PATENT DOCUMENTS

| | | | |
|---|---|---|---|
| 6,867,367 B2 * | 3/2005 | Zimmerman | H01L 21/50 174/528 |
| 8,165,730 B2 * | 4/2012 | Winterhalter | G07C 5/085 701/3 |
| 8,944,822 B2 * | 2/2015 | Gelinske | G09B 9/30 434/35 |
| 9,202,318 B2 * | 12/2015 | Batcheller | G07C 5/008 |
| 9,232,675 B2 * | 1/2016 | Schurr | H05K 7/1481 |
| 9,648,766 B1 * | 5/2017 | Eom | H05K 5/0217 |
| 9,661,773 B2 * | 5/2017 | Mijac | H05K 5/03 |
| 10,097,615 B1 * | 10/2018 | Preissl | G08G 5/003 |
| 10,404,949 B2 * | 9/2019 | Lee | H04N 5/2252 |

(Continued)

*Primary Examiner* — Xanthia C Cunningham
(74) *Attorney, Agent, or Firm* — Fenwick & West LLP

(57) ABSTRACT

A portable fleet management system enables an operator to efficiently manage a fleet of drones in the field. The portable fleet management system may a comprise a portable housing that houses a charging system for charging batteries of the drones, a storage system for storing images, video, or other sensor data captured by the drones, and various other control, input/output, and processing elements for enabling efficient management of a drone fleet. The charging system is beneficially configured to enable charging of multiple different makes and models of drone batteries that may have different form factors and charging requirements. Furthermore, the storage system may enable efficient offloading, processing, sorting, and backup storage of images or video captured by the drones.

20 Claims, 6 Drawing Sheets

(56) References Cited

U.S. PATENT DOCUMENTS

| | | | |
|---|---|---|---|
| 2003/0152145 A1* | 8/2003 | Kawakita | H04N 7/083 375/240.12 |
| 2006/0176651 A1* | 8/2006 | Olzak | F16L 5/04 361/679.46 |
| 2007/0020588 A1* | 1/2007 | Batcheller | G09B 9/08 434/30 |
| 2009/0147758 A1* | 6/2009 | Kumar | H04L 67/04 370/338 |
| 2009/0277683 A1* | 11/2009 | Winterhalter | B64D 45/00 174/546 |
| 2014/0081483 A1* | 3/2014 | Weinmann | G08G 5/0082 701/14 |
| 2016/0288923 A1* | 10/2016 | Hausmann | B64D 45/00 |
| 2019/0016584 A1* | 1/2019 | Londono Ortiz | B67D 7/84 |
| 2019/0367353 A1* | 12/2019 | McNamara | B67D 7/04 |

* cited by examiner

PORTABLE FLEET MANAGEMENT SYSTEM FOR AUTONOMOUS AERIAL VEHICLES

CROSS-REFERENCE TO RELATED APPLICATIONS

This application claims the benefit of U.S. Provisional Application No. 62/726,964 filed on Sep. 4, 2018, which is incorporated by reference herein.

BACKGROUND

Technical Field

This application relates to a portable fleet management system for managing a fleet of autonomous aerial vehicles.

Description of the Related Art

Operators of autonomous aerial vehicles (i.e., drones) often spend extended hours in the field conducting operations. A single flight time of a drone is limited by the battery capacity of the drone. Furthermore, for operations involving high definition image or video capture, storage capacity of a drone may become an additional factor limiting flight time. Thus, for an extended operation, the drone operator may deploy a fleet of multiple drones that can operate in shifts. A drone fleet often includes drones of different makes and models that have different capabilities and operating requirements. As a result, managing a fleet of drones in the field can be time consuming and costly.

SUMMARY

A portable fleet management system manages a fleet of autonomous aerial vehicles. In an embodiment, the portable fleet management system comprises a housing, a central power system within the housing, a central control system within the housing, at least first and second universal docks within the housing, and at least first and second swappable battery sleeves removably securable to the respective first and second universal docks. The central power system supplies power via a first power path to at least a first drone battery having a first structure and supplies power via a second power path to a second drone battery having a second structure different than the first structure. The central control system controls the power outputted by the central power system to charge the first drone battery in response to first battery data associated with the first drone battery received via a first data path, and controls the power outputted by the central power system to charge the second drone battery in response to second battery data associated with the second drone battery received via a second data path. The first universal dock includes a first sleeve-side connector electrically coupled to the central power system via the first power path and electrically coupled to the central control system via the first data path. The second universal dock similarly includes a second sleeve-side connector electrically coupled to the central power system via the second power path and electrically coupled to the central control system via the second data path. The second universal dock has a common form factor with the first universal dock. The first swappable battery sleeve includes a first dock-side connector to electrically connect to the first sleeve-side connector via the first power path and the first data path and a first battery-side connector electrically coupled to the first dock-side connector via the first power path and the first data path. The first swappable battery sleeve has a first structural configuration to securely mate with the first drone battery. The second swappable battery includes a second dock-side connector to electrically connect to the second sleeve-side connector via the second power path and the second data path and a second battery-side connector electrically coupled to the second dock-side connector via the second power path and the second data path. The second swappable battery sleeve has a second structural configuration to securely mate with the second drone battery. The second structural configuration of the second swappable battery sleeve is different than the first structural configuration of the first swappable battery sleeve.

DETAILED DESCRIPTION

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

A portable fleet management system enables an operator to efficiently manage a fleet of drones in the field. The portable fleet management system may a comprise a portable housing that houses a charging system for charging batteries of the drones, a storage system for storing images, video, or other sensor data captured by the drones, and various other control, input/output, and processing elements for enabling efficient management of a drone fleet. The housing may comprise, for example, a hard-shell housing having a form factor of a small suitcase or briefcase (e.g., suitable for airline carry-on). The charging system is beneficially configured to enable charging of multiple different makes and models of drone batteries that may have different form factors and charging requirements. Furthermore, the storage system may enable efficient offloading, processing, sorting, and backup storage of images or video captured by the drones.

Figure 1:
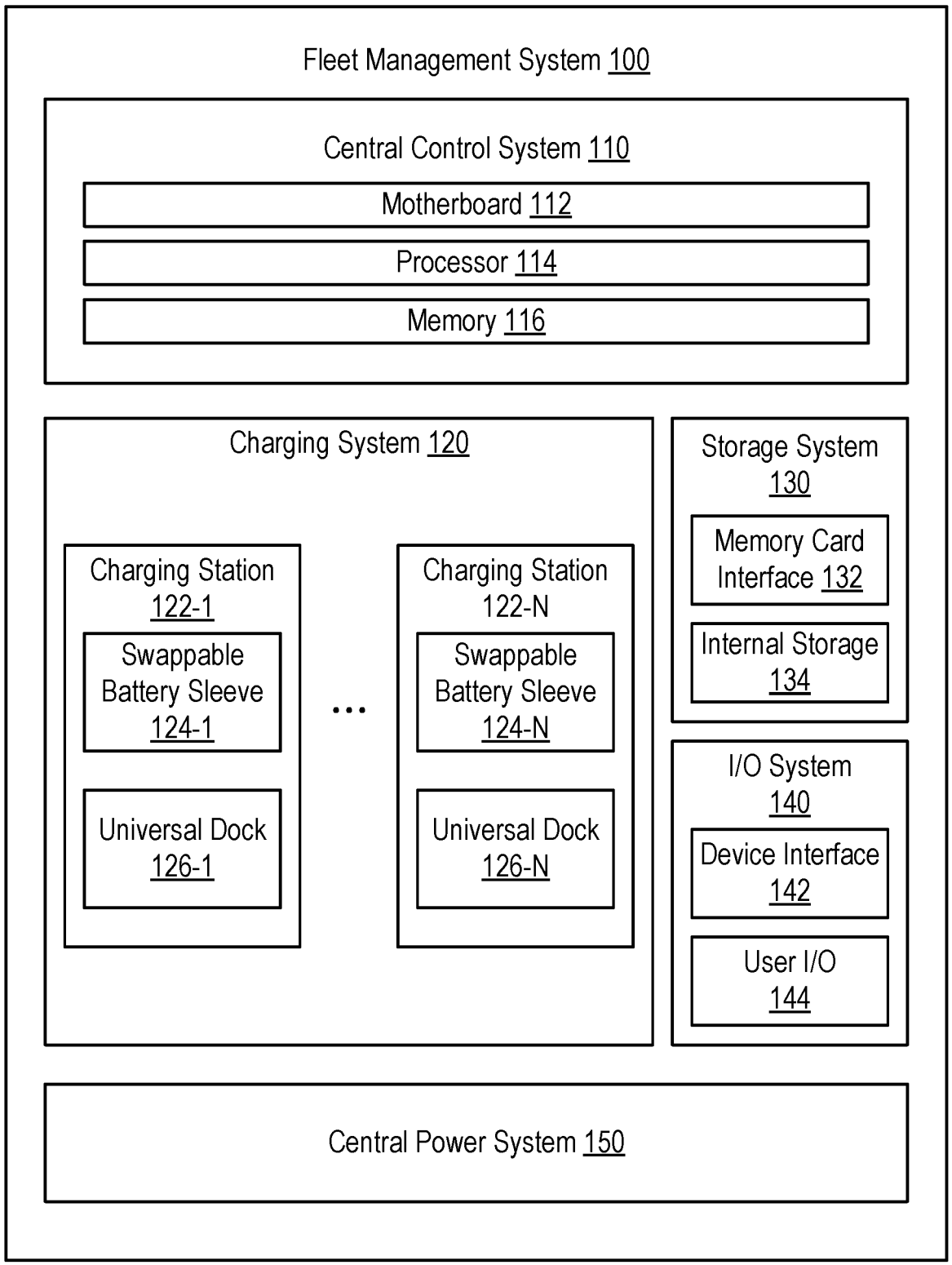
FIG. 1 is a block diagram illustrating an example embodiment of a fleet management system.

FIG. 1 is a block diagram illustrating an embodiment of a fleet management system 100. The fleet management system 100 comprises a central control system 110, a charging system 120, a storage system 130, an I/O system 140, and a central power system 150. Other components of the fleet management system 100 may be omitted from FIG. 1 for conciseness of description. In an embodiment, the illustrated components of the fleet management system 100 are integrated within a portable housing. Alternatively, one or more of the illustrated components may instead be implemented on an external device (e.g., mobile phone, tablet, or laptop) or on a server (e.g., a cloud server).

The central control system 110 comprises a motherboard 112, a processor 114, and a memory 116. The memory 116 comprises a non-transitory computer-readable storage medium that stores instructions that when executed by the processor 114 causes the processor 114 to carry out functions attributed to various modules of the fleet management system 100 described herein. The motherboard 112 comprises a printed circuit board (PCB) that includes one or more busses providing interconnections between the processor 114, the memory 116, the charging system 120, the storage system 130, the I/O system 140, the central power system 150, or other components of the fleet management system 100.

The charging system 120 comprises a plurality of integrated charging stations 122 (e.g., charging stations 122-1, . . . , 122-N) that charges respective drone batteries that may be of different makes and models and may have different form factors and charging requirements. In an embodiment, the charging system 120 can charge multiple different batteries of different battery types concurrently. Each charging station 122 comprises a swappable battery sleeve 124 (e.g., swappable battery sleeves 124-1, . . . , 124-N) and a universal dock 126 (e.g., universal docks 126-1, . . . , 126-N). Each swappable battery sleeve 124 is configured to mate with a respective universal docks 126 and may have a form factor configured to mate with a particular battery type. The swappable battery sleeves 124 may have different form factors that are specific to different battery form factors and may be swappable in and out of the charging station 122 depending on of the type of battery to be charged. Thus, an operator that desires to use the fleet management system 100 to charge a particular battery type may swap in an appropriate corresponding swappable battery sleeve 124 having a form factor corresponding to the battery type. An operator that desires to concurrently charge multiple different types of batteries having different form factors and charging requirements may utilize different types of swappable battery sleeves 124 in the different available charging stations 122. The swappable battery sleeves 124 may be structured to enable the operator to quickly insert or remove the swappable battery sleeves 124 without requiring specialized tools.

Each universal dock 126 is configured to connect a swappable battery sleeve 124 to the central power system 150 to enable the swappable battery sleeves 124 to charge the respective batteries. Additionally, each universal dock 126 may identify a type of battery connected to the swappable battery sleeve 124 and control power to the swappable battery sleeve 124 to charge the battery according to the battery's particular charging specifications. Unlike the swappable battery sleeves 124, the universal docks 126 may each have a substantially identical form factor and may be fixedly secured within the housing. Embodiments of the charging stations 122 are described in further detail below with reference to FIGS. 2-6.

The storage system 130 stores images, video, or other sensor data that may be offloaded from the drones. In an embodiment, the storage system 130 may comprise a memory card interface 132 and an internal storage 134. The memory card interface 132 is configured to receive a memory card that may store images, video, or other sensor data captured by a drone during an operation. The memory card interface 132 may read the data from the memory card and provide it to the central control system 110 for processing or directly to the internal storage 134 for storage. The internal storage comprises a non-transitory storage medium (e.g., a FLASH memory) for storing data read from the memory card 132 or other sources (e.g., the central control system 110 or the I/O system 140).

In an embodiment, the storage system 130 interfaces with the central control system 110 to intelligently organize content obtained from the memory card interface 132 for storage in the internal storage 134. For example, the central control system 110 may process image and video content to automatically detect and remove duplicate content and to organize related content into folders. The central control system 110 may furthermore add or modify filenames and/or metadata associated with images and video to enable the operator to more efficiently review the obtained images and video.

The input/output (I/O) system 140 comprises interfaces for inputting and outputting data and control signals to and from the fleet management system 100. In an embodiment, the I/O system 140 includes one or more device interfaces 142 and one or more user I/O elements 144. The device interface 142 may comprise a wired or wireless interface for connecting the fleet management system 100 to one or more external computing devices. For example, the device interface 142 may comprise an interface for connecting the fleet management system 100 to a mobile device such as a smartphone or tablet to enable the user to interact with the fleet management system 100 via a fleet management application. Here, the fleet management application may enable the operator to perform tasks such as viewing and managing images or videos from the internal storage 134, viewing and managing flight data, viewing battery charging information, or performing other tasks relevant to managing the drone fleet. The device interface 142 may include one or more of a universal serial bus (USB) interface, Bluetooth interface, WiFi interface, cellular (e.g., 3G, 4G, 5G) interface, an Ethernet interface, or other interface for communicating with an external device. In an embodiment, the I/O system 140 may include multiple device interfaces 142 of different types.

The user I/O 144 may include user control inputs such as buttons, switches, dials, touch screens, or other control elements that enable the operator to control various aspects of the flight management system 100. For example, the user I/O 144 may include switches to enable the operator to enable or disable different charging stations 122, to format or eject a memory card from the memory card interface 132, or perform other tasks. The user I/O 144 may also include feedback elements such as LEDs, displays, or speakers to provide feedback to the operator in response to various actions or detected conditions. For example, LEDs may be used to indicate a charging status of the various charging stations 122 or a state of available memory in the internal storage 134.

Figure 2:
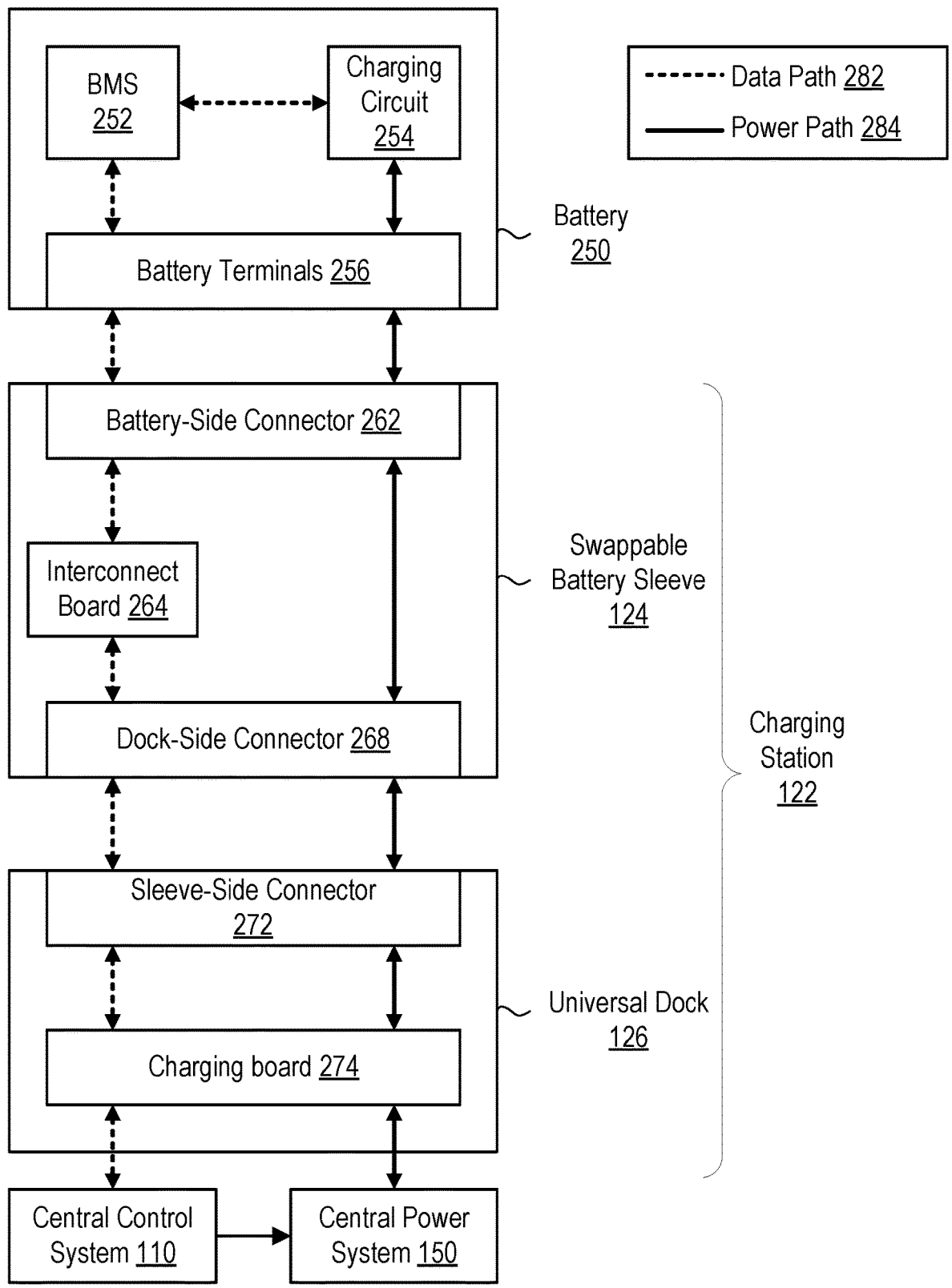
FIG. 2 is a block diagram illustrating an example embodiment of a charging station of a fleet management system.

FIG. 2 illustrates an example embodiment of a charging station 122 charging a battery 250. In FIG. 2 a power path 284 comprising interconnections for supplying power to charge the battery 250 is illustrated in solid lines while a data path 282 comprising interconnections for communicating data relating to charging or other conditions of the battery 250 is illustrated in dashed lines.

The battery 250 comprises a smart battery having a charging circuit 254 for charging the battery 250 and a battery management system (BMS) 252 that manages operation of the battery 250. The BMS 252 may perform tasks such as taking actions to protect the battery 250 from operating outside its safe operating conditions, monitoring the battery state, calculating and reporting various data relating to the battery conditions, authenticating a charger or device connected to the battery 250, or other tasks related to battery operation. The battery terminals 256 comprise terminals for receiving power to the charging circuit 254, outputting power to a drone (when connected to the drone rather than the swappable battery sleeve 124), and accessing the BMS 252.

The swappable battery sleeve 124 comprises a battery-side connector 262 for connecting to the battery terminals 256, a dock-side connector 268 for connecting to the universal dock 126, an interconnect board 264, and interconnections (e.g., portions of the data path 282 and the power path 284) between the components. The interconnect board 264 communicates with the BMS 252 via the battery-side connector 262 and the battery terminals 256. The interconnect board 264 determines a battery type of the battery 250 based on an identifier signal received from the BMS 252. The interconnect board 264 may furthermore store a battery type associated with the swappable battery sleeve 124 that is uniquely associated with the battery type for which the swappable battery sleeve 124 is compatible. The interconnect board 264 compares the stored battery type with the battery type discovered from the identifier signal from the battery 250 to determine if they match. If the battery types do not match, the interconnect board 264 may communicate an incompatibility signal to the central control system 110 (via the universal dock 126). In this case, the central control system 110 may output a notification to the operator via the I/O system 140 and may prevent the central power system 150 from providing power via the power path 284 to the battery 250. Otherwise, if the battery types match, the interconnect board 264 may send a signal to the central control system 110 indicating that the battery 250 is compatible, and the central control system 110 may enable the central power system 150 to provide power to the battery 250 via the power path 284.

The universal dock 126 comprises a sleeve-side connector 272 for connecting to the dock-side connector 268 of the swappable battery sleeve 124 and a charging board 274 coupled to the central control system 110 via the data path 282 and to the central power system 150 via the power path 284. If the battery 250 is compatible as described above, the central control system 110 controls the charging board 274 to provide power to the charging circuit 254 of the battery 250 from the central power system 150 via the power path 284 to charge the battery 250 according to the appropriate charging voltage, current, or other charging specifications. In an embodiment, the charging specifications may be read from the BMS 252 of the battery 250. Alternatively, the charging specifications may be stored in a lookup table by the central control system 110 and obtained based on the identified battery type. In an embodiment, charging information may also be relayed to a mobile device of the operator via the I/O system 140 in real-time as the battery charges for display via a mobile application. For example, the I/O system 140 may push status information to the mobile application or may push various alerts. These alerts may be utilized, for example, to provide safety notifications to the user such as when a battery is overheating or when a short circuit is detected.

In an alternative embodiment, instead of the interconnect board 264 determining if the battery 250 is compatible with the swappable battery sleeve 124, the central control system 110 may instead obtain the battery type of the battery 250 and the battery sleeve type of the swappable battery sleeve 124 via the data path 282 and the central control system 110 may to determine if the battery 250 is compatible with the swappable battery sleeve 124. In another embodiment, compatibility may be determined separately at both the interconnect board 264 and the central control system 110. In yet another embodiment, the central control system 110 may independently determine if the swappable battery sleeve 124 is compatible with the portable fleet management system 100 and prevent the central power system 150 from providing power to the swappable battery sleeve 124 if an incompatibility is detected.

Figure 3:
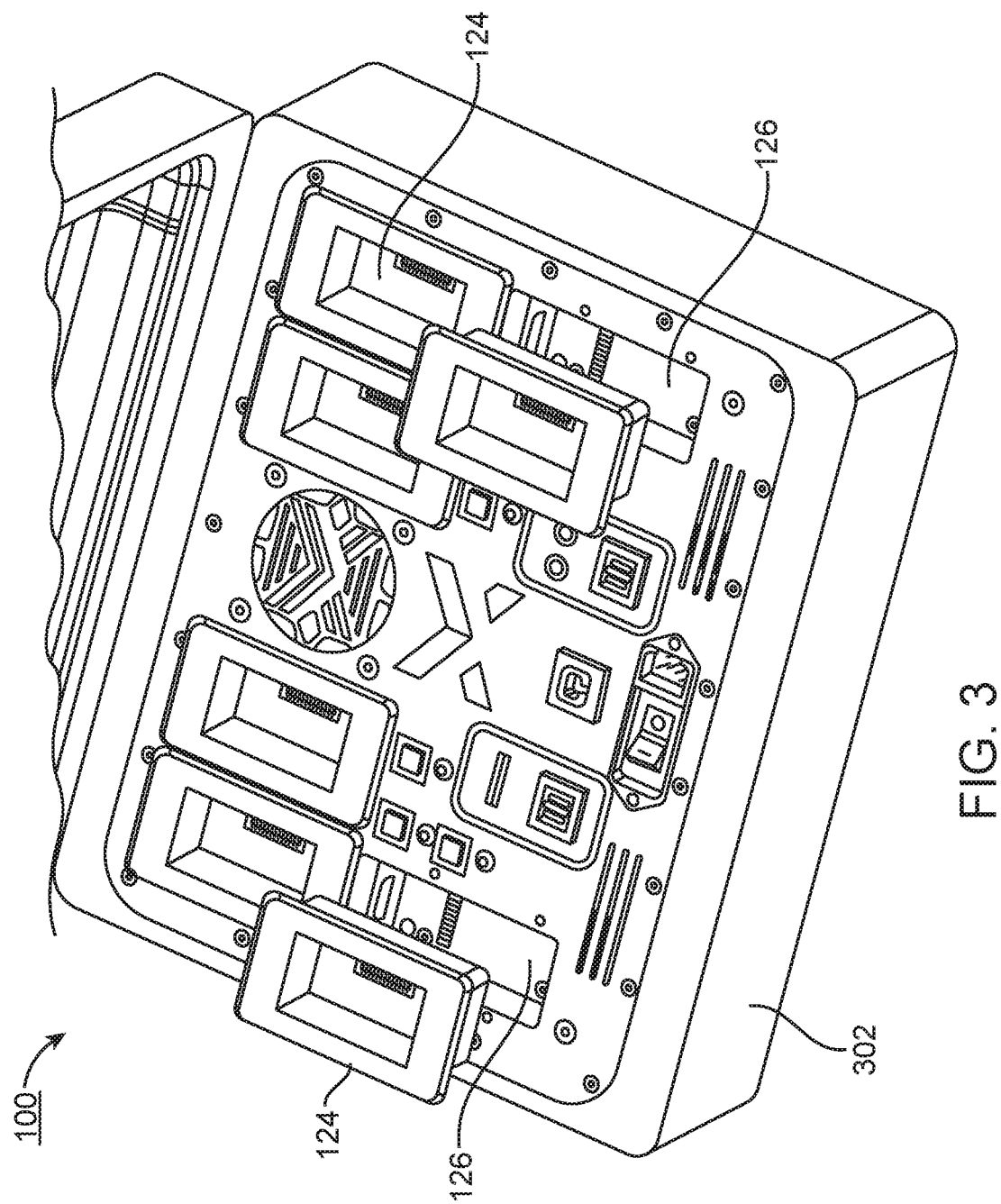
FIG. 3 illustrates an example embodiment of a portable fleet management system in a suitcase form factor.

FIG. 3 illustrates an example embodiment of the fleet management system 100. The fleet management system 100 comprises a housing 302 for housing the various components of the fleet management system 100 described above. As illustrated, the fleet management system 100 includes a plurality of charging stations 122 that each include a swappable battery sleeve 124 and a universal dock 126. The different swappable battery sleeves 124 may each be compatible with a different battery type that may have a different form factors and different charging requirements. In the embodiment of FIG. 3, the fleet management system 100 is illustrated with the swappable battery sleeves 124 removed from the universal docks 126. As will be further described below, the swappable battery sleeves 124 can slide into and connect to the respective universal docks 126 to enable charging.

Figure 4A:
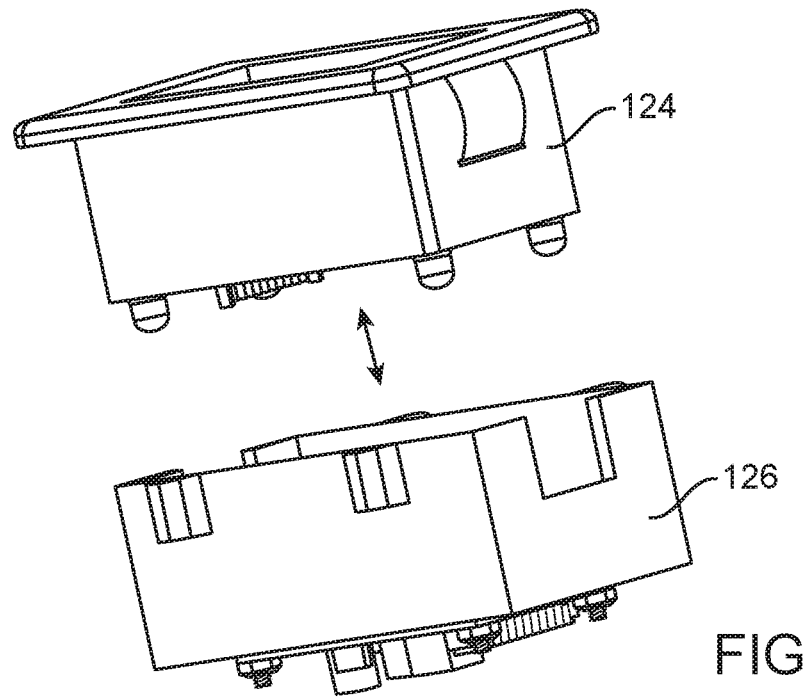
FIG. 4A illustrates a first view of a swappable battery sleeve coupling to a universal dock.
Figure 4B:
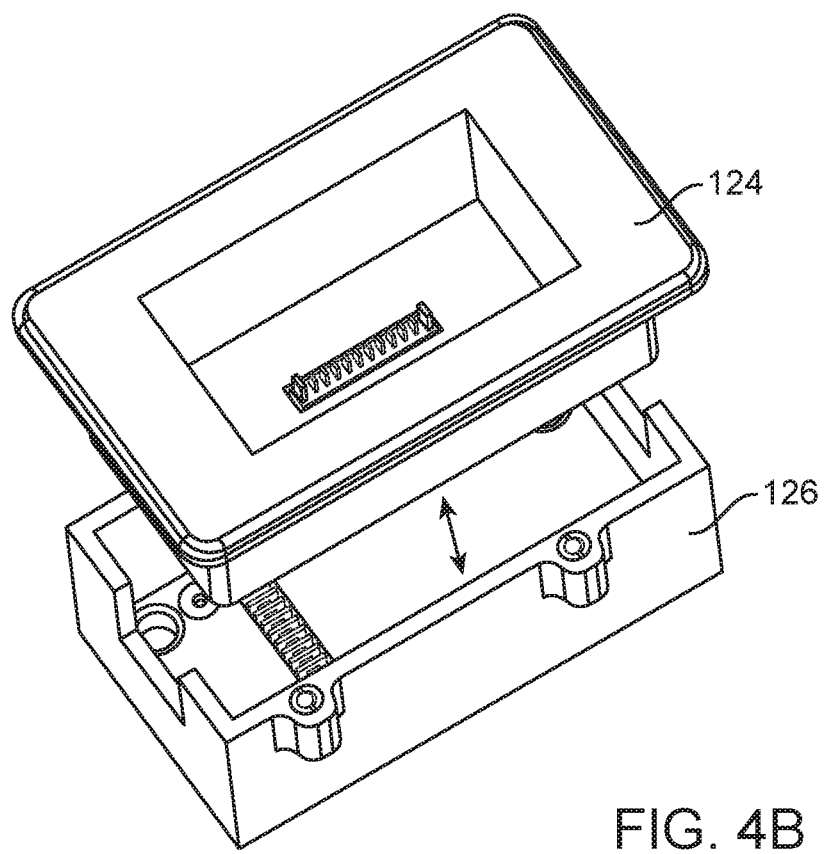
FIG. 4B illustrates a second view of a swappable battery sleeve coupling to a universal dock.

FIGS. 4A-B illustrates exploded views of a swappable battery sleeve 124 and a universal dock 126 removed from the housing 302. The universal dock 126 may be inserted into the universal dock 126 and securely snaps into place. In an embodiment, the swappable battery sleeve 124 may be securely inserted and removed from the universal dock 126 without tools. In the illustrated embodiment, the universal dock 126 generally comprises a box-like form factor having a rectangular bottom surface, four side walls along edges of the rectangular bottom surface and at right angles to the bottom surface, and a top opening for receiving the swappable battery sleeve 124. The swappable battery sleeve 124 has outer surfaces generally structured to slide into and securely mate with the universal dock 126. For example, the outer surfaces of the swappable battery sleeve 124 may similarly comprise box-like form factor having a rectangular bottom surface and four side walls along edges of the rectangular bottom surface at right angles to the bottom surface. The interior surfaces of the swappable battery sleeve 124 are structured to mate with a corresponding form factor of a battery type associated with the swappable battery sleeve 124. The interior surfaces of the swappable battery sleeve 124 may vary in different swappable battery sleeves 124 to enable coupling to different makes and models of batteries that may have different form factors and connector locations. Furthermore, the swappable battery sleeve 124 may be keyed to prevent an operator from inserting a battery of the wrong type or incorrectly inserting a battery in the wrong orientation. While the illustrated embodiment shows a swappable battery sleeve 124 with a substantially rectangular volumetric opening for mating with a substantially rectangular battery 250, other embodiments may include different shaped openings for mating with different battery form factors. In alternative embodiments, the universal dock 126 may have a different form factor and the outer surfaces of the swappable battery sleeves 124 may have corresponding structure to mate with the universal dock 126.

Figure 5:
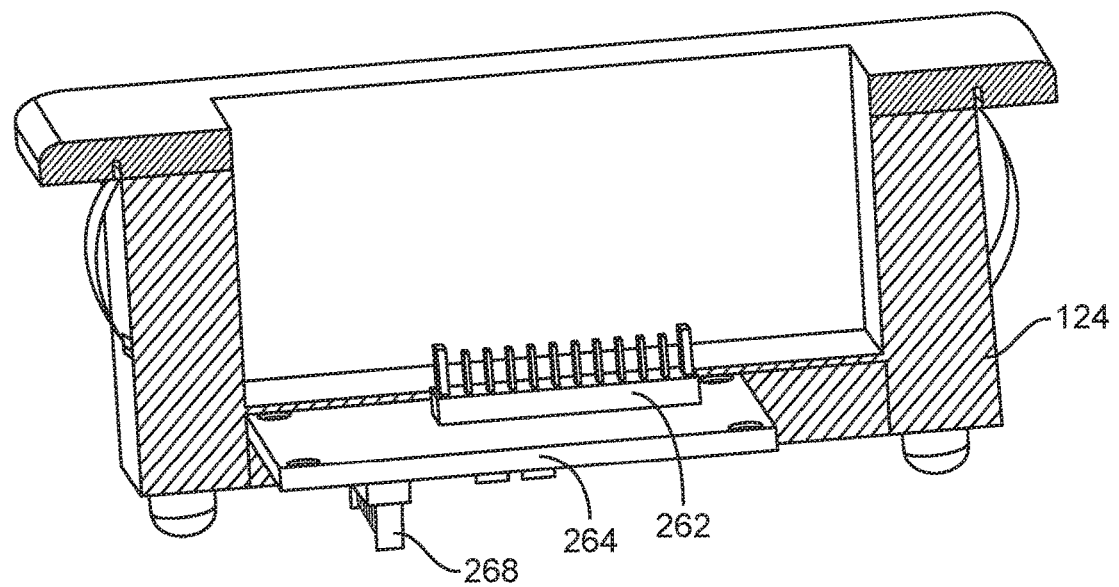
FIG. 5 illustrates a third view of a swappable battery sleeve coupling to a universal dock.
Figure 5:
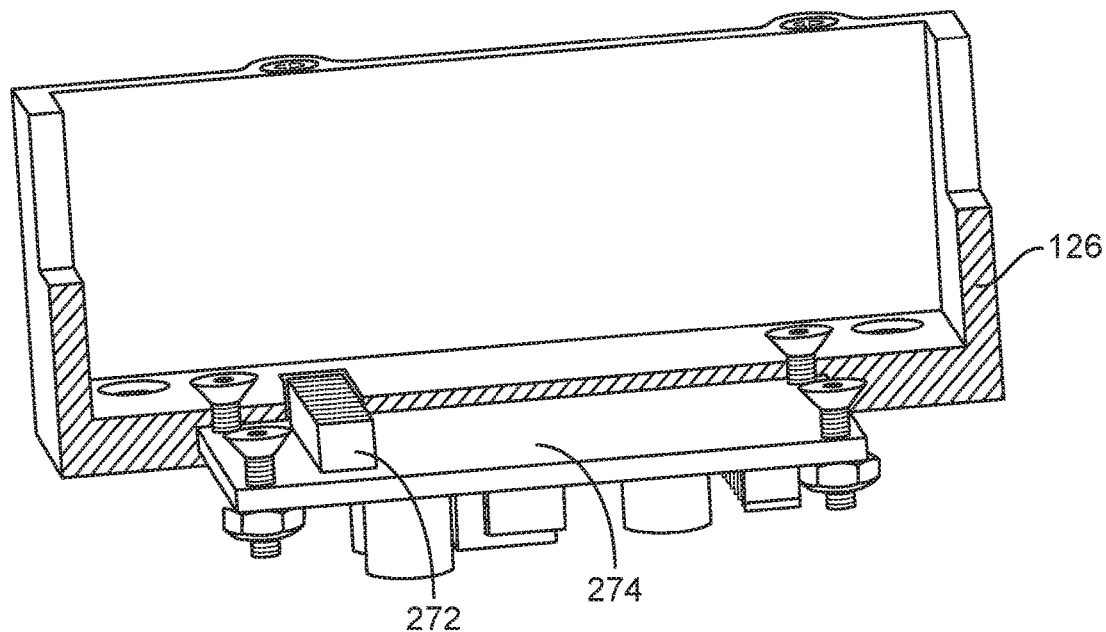

FIG. 5 illustrates a cutaway view of the swappable battery sleeve 124 and the universal dock 126. In this example, the swappable battery sleeve 124 includes the interconnect board 264 mounted on a bottom surface of the swappable battery sleeve 124. The battery-side connector 262 is connected to a top surface of the interconnect board 264 and a dock-side connector 268 is mounted to a bottom surface of the swappable battery sleeve 124. In an embodiment, the battery-side connector 262 and the dock-side connector 268 are oriented in different directions (e.g., perpendicular to each other) and laterally offset from each other. Different embodiments of the swappable battery sleeve 124 configured for use with different battery types may include a different style battery-side connector 262, may include a battery-side connector 262 with a different orientation, or may have the battery-side connector 262 located in a different position within the swappable battery sleeve 124 depending on the battery form factor. Thus, the swappable battery sleeve 124 may be configured to enable the battery-side connector 262 to connect with the battery terminals 256 of the specific battery type.

Figure 6:
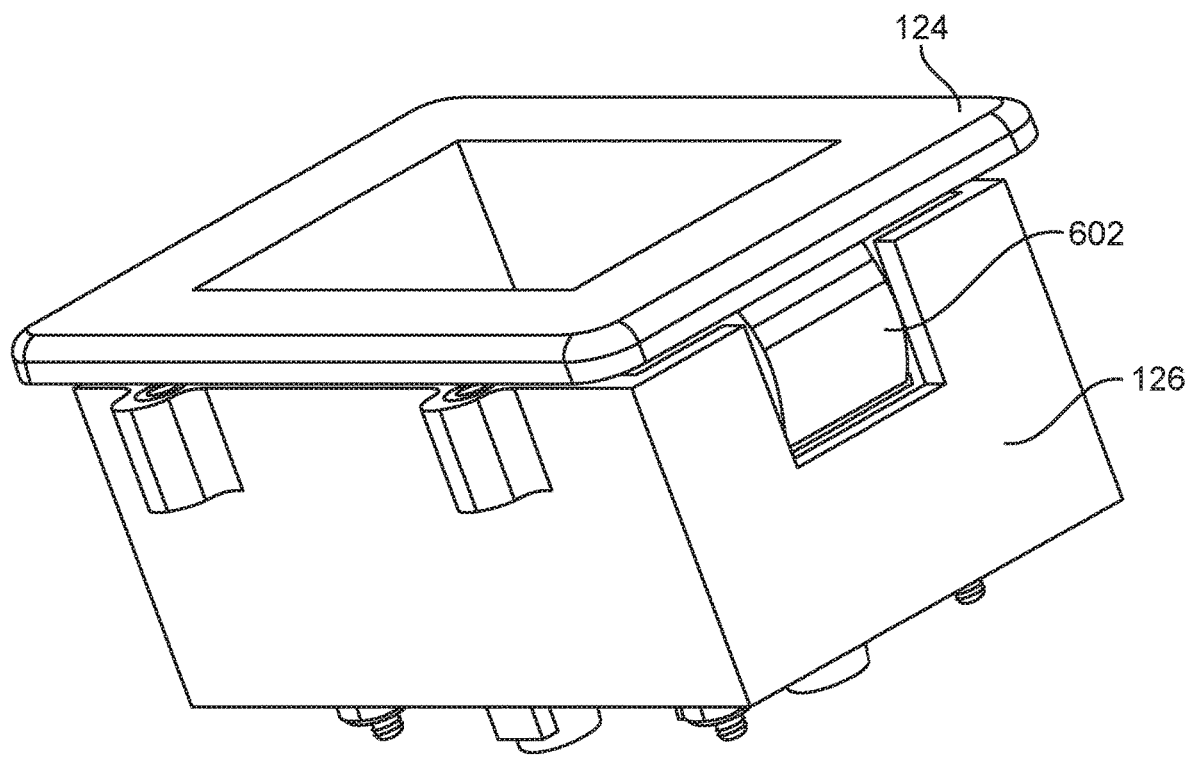
FIG. 6 illustrates a swappable battery sleeve coupled to a universal dock.

FIG. 6 illustrates a swappable battery sleeve 124 secured within the universal dock 126. As illustrated, the swappable battery sleeve 124 includes tabs 602 that securely lock the swappable battery sleeve 124 to the universal dock 126. The tabs 602 when squeezed, release the swappable battery sleeve 124 from the universal dock 126 so that it may be removed in a tool-less manner.

Upon reading this disclosure, those of skill in the art will appreciate still additional alternative structural and functional designs for the disclosed embodiments from the principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the disclosed embodiments herein without departing from the scope.

The invention claimed is:

1. A portable fleet management system for managing a fleet of autonomous aerial vehicles, the portable fleet management system comprising:
   a housing;
   a central power system within the housing, the central power system for supplying power via a first power path to at least a first drone battery having a first structure and for supplying power via a second power path to a second drone battery having a second structure different than the first structure;
   a central control system for controlling the power outputted by the central power system to charge the first drone battery in response to first battery data associated with the first drone battery received via a first data path, and for controlling the power outputted by the central power system to charge the second drone battery in response to second battery data associated with the second drone battery received via a second data path;
   a first universal dock secured within the housing, the first universal dock including a first sleeve-side connector electrically coupled to the central power system via the first power path and electrically coupled to the central control system via the first data path;
   a second universal dock securing within the housing, the second universal dock including a second sleeve-side connector electrically coupled to the central power system via the second power path and electrically coupled to the central control system via the second data path, the second universal dock having a common form factor with the first universal dock;
   a first swappable battery sleeve removably securable to the first universal dock, the first swappable battery sleeve including a first dock-side connector to electrically connect to the first sleeve-side connector via the first power path and the first data path and a first battery-side connector electrically coupled to the first dock-side connector via the first power path and the first data path, the first swappable battery sleeve having a first structural configuration to securely mate with the first drone battery;
   a second swappable battery sleeve removably securable to the second universal dock, the second swappable battery sleeve including a second dock-side connector to electrically connect to the second sleeve-side connector via the second power path and the second data path and a second battery-side connector electrically coupled to the second dock-side connector via the second power path and the second data path, the second swappable battery sleeve having a second structural configuration to securely mate with the second drone battery, wherein the second structural configuration of the second swappable battery sleeve is different than the first structural configuration of the first swappable battery sleeve.

2. The portable fleet management system of claim 1, wherein the first swappable battery sleeve includes a first side that connects to the first universal dock and a second side that connects to the first drone battery, wherein the second swappable battery sleeve includes a first side that connects to the second universal dock and a second side that connects to the second drone battery, wherein the first side of the first swappable battery sleeve and the first side of the second swappable battery sleeve have a common structural configuration, and wherein the second side of the first swappable battery sleeve and the second side of the second swappable battery sleeve having different structural configurations.

3. The portable fleet management system of claim 1, wherein the first swappable battery sleeve and the second swappable battery sleeve differ in at least one of: surface contours of the first and second swappable battery sleeves, locations of the first and second battery-side connectors, orientations of the first and second battery-side connectors, and types of the first and second battery-side connectors.

4. The portable fleet management system of claim 1, wherein the first swappable battery sleeve includes a first quick-release mechanism for removably securing to the first universal dock and wherein the second swappable battery sleeve includes a second quick-release mechanism for removably securing to the second universal docking.

5. The portable fleet management system of claim 1, wherein the central control system is configured to control operation of the central power system to prevent the central power system from providing power to the first drone battery in response to receiving an incompatibility signal associated with the first drone battery;

wherein the first swappable battery sleeve comprises a first interconnect board to communicate with a first battery management system of the first drone battery to identify a first battery type of the first drone battery, to determine if the first battery type is compatible with the first swappable battery sleeve, and to communicate the incompatibility signal to the central control system via a data path through the first universal dock in response to detecting that the first drone battery is incompatible.

6. The portable fleet management system of claim 1, wherein the central control system is configured to obtain a battery type of the first drone battery and a sleeve type of the first swappable battery sleeve, to determine if the first swappable battery sleeve is compatible with the first drone battery and with the portable fleet management system, and to control operation of the central power system to prevent the central power system from providing power to the first drone battery in response to detecting an incompatibility.

7. The portable fleet management system of claim 1, wherein the central control system is configured to obtain a first battery type of the first drone battery and a second battery type of the second drone battery, to identify a first power requirement of the first drone battery and the second drone battery, and to control the central power system to charge the first drone battery according to the first power requirement and to charge the second drone battery according to the second power requirement, wherein the first power requirement is different than the second power requirement.

8. The portable fleet management system of claim 1, further comprising:
an internal storage device integrated within the housing;
a memory card interface integrated within the housing for receiving a memory card; and
wherein the central control system is further configured to read data from the memory card and write the data to the internal storage device.

9. A portable fleet management system for managing a fleet of autonomous aerial vehicles, the portable fleet management system comprising:
a housing;
a central power system within the housing, the central power system for supplying power to at least a first drone battery having a first structure and a second drone battery having a second structure different than the first structure;
a first universal dock secured within the housing, the first universal dock including a first sleeve-side connector electrically coupled to the central power system;
a second universal dock securing within the housing, the second universal dock including a second sleeve-side connector electrically coupled to the central power system, the second universal dock having a common form factor with the first universal dock;
a first swappable battery sleeve removably securable to the first universal dock, the first swappable battery sleeve including a first dock-side connector to electrically connect to the first sleeve-side connector of the first universal dock and a first battery-side connector electrically coupled to the first dock-side connector, the first swappable battery sleeve having a first configuration to securely mate with the first drone battery and to enable charging of the first drone battery from the central power system;
a second swappable battery sleeve removably securable to the second universal dock, the second swappable battery sleeve including a second dock-side connector to electrically connect to the second sleeve-side connector of the second universal dock and a second battery-side connector electrically coupled to the second dock-side connector, the second swappable battery sleeve having a second configuration to securely mate with the second drone battery and to enable charging of the second drone battery from the central power system, wherein the second configuration of the second swappable battery sleeve is different than the first configuration of the first swappable battery sleeve.

10. The portable fleet management system of claim 9, wherein the first swappable battery sleeve includes a first side that connects to the first universal dock and a second side that connects to the first drone battery, wherein the second swappable battery sleeve includes a first side that connects to the second universal dock and a second side that connects to the second drone battery, wherein the first side of the first swappable battery sleeve and the first side of the second swappable battery sleeve have a common structural configuration, and wherein the second side of the first swappable battery sleeve and the second side of the second swappable battery sleeve having different structural configurations.

11. The portable fleet management system of claim 9, wherein the first swappable battery sleeve and the second swappable battery sleeve differ in at least one of: surface contours of the first and second swappable battery sleeves, locations of the first and second battery-side connectors, orientations of the first and second battery-side connectors, and types of the first and second battery-side connectors.

12. The portable fleet management system of claim 9, wherein the first swappable battery sleeve includes a first quick-release mechanism for removably securing to the first universal dock and wherein the second swappable battery sleeve includes a second quick-release mechanism for removably securing to the second universal docking.

13. The portable fleet management system of claim 9, further comprising:
a central control system to control operation of the central power system to prevent the central power system from providing power to the first drone battery in response to receiving an incompatibility signal associated with the first drone battery;
wherein the first swappable battery sleeve comprises a first interconnect board to communicate with a first battery management system of the first drone battery to identify a first battery type of the first drone battery, to determine if the first battery type is compatible with the first swappable battery sleeve, and to communicate the incompatibility signal to the central control system via a data path through the first universal dock in response to detecting that the first drone battery is incompatible.

14. The portable fleet management system of claim 9, further comprising:
a central control system to obtain a battery type of the first drone battery and a sleeve type of the first swappable battery sleeve, to determine if the first swappable battery sleeve is compatible with the first drone battery and with the portable fleet management system, and to control operation of the central power system to prevent the central power system from providing power to the first drone battery in response to detecting an incompatibility.

15. The portable fleet management system of claim 9, further comprising:

a central control system to obtain a first battery type of the first drone battery and a second battery type of the second drone battery, to identify a first power requirement of the first drone battery and the second drone battery, and to control the central power system to charge the first drone battery according to the first power requirement and to charge the second drone battery according to the second power requirement, wherein the first power requirement is different than the second power requirement.

16. The portable fleet management system of claim 9, further comprising:
    an internal storage device integrated within the housing;
    a memory card interface integrated within the housing for receiving a memory card; and
    a central control system to read data from the memory card and write the data to the internal storage device.

17. The portable fleet management system of claim 16, wherein the central control system is further configured to automatically detect and remove duplicate content of the data.

18. A swappable battery sleeve for interfacing with a drone battery in a portable fleet management system, the swappable battery sleeve comprising:
    a battery housing having a form factor with a first side structured for securely coupling to a drone battery and a second side for removably coupling to a universal battery sleeve;
    a battery-side connector to couple to battery terminals of the drone battery when the drone battery is secured within the battery housing;
    a dock-side connector on the second side of the battery housing to couple to a connector of a universal battery sleeve when the battery housing is inserted within the universal battery sleeve; and
    an interconnect board to communicate with a battery management system of the drone battery to identify a battery type of the drone battery via a data path, to determine if the battery type is compatible with the swappable battery sleeve, and to communicate the incompatibility signal to a central control system via the data path through the dock-side connector in response to detecting that the drone battery is incompatible.

19. The swappable battery sleeve of claim 18, further comprising a quick-release mechanism for removably securing to a reciprocal securing mechanism of the universal dock.

20. The swappable battery sleeve of claim 19, wherein the quick-release mechanism comprises:
    a first depressible tab on a first wall of the swappable battery sleeve structured to secure with a first reciprocal opening in a second wall of the universal dock; and
    a second depressible tab on a second wall of the swappable battery sleeve structured to secure with a second reciprocal opening in a second wall the universal dock.

* * * * *